United States Patent
Kusumi

(10) Patent No.: US 6,548,900 B1
(45) Date of Patent: Apr. 15, 2003

(54) SEMICONDUCTOR DEVICE AND FABRICATION METHOD THEREOF

(75) Inventor: Yoshihiro Kusumi, Hyogo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 09/422,262

(22) Filed: Oct. 21, 1999

(30) Foreign Application Priority Data

Apr. 27, 1999 (JP) ............................................. 11-119334

(51) Int. Cl.⁷ ........................ H01L 23/48; H01L 23/52; H01L 29/40
(52) U.S. Cl. ........................ 257/758; 257/750; 257/635
(58) Field of Search ............................... 257/758, 635, 257/637, 640, 649, 622, 750

(56) References Cited

U.S. PATENT DOCUMENTS 6,037,664 A * 3/2000 Zhao et al.
6,133,144 A * 10/2000 Tsai et al.
6,143,646 A * 11/2000 Wetzel
6,271,127 B1 * 8/2001 Liu et al.

FOREIGN PATENT DOCUMENTS

| JP | 8-335634 | 12/1996 |
| JP | 9-55429 | 2/1997 |
| JP | 9-153545 | 6/1997 |

* cited by examiner

Primary Examiner—Sheila V. Clark
(74) Attorney, Agent, or Firm—McDermott, Will & Emery

(57) ABSTRACT

A connection hole stopper film such as the silicon nitride film is formed to directly cover a lower interconnection. A lower interlayer insulation film is formed to directly cover that connection hole stopper film. An upper interlayer insulation film differing in etching property from the lower interlayer insulation film is formed to directly cover the lower interlayer insulation film. The upper interlayer insulation film is subjected to anisotropic etching, whereby an upper interconnection trench is formed. An upper interconnection is formed in that upper interconnection trench. A semiconductor device is obtained reduced in capacitance between interconnections and variation in the interconnection resistance.

8 Claims, 18 Drawing Sheets

SEMICONDUCTOR DEVICE AND FABRICATION METHOD THEREOF

BACKGROUND OF THE INVENTION

1. Field of the Invention

The present invention relates to a semiconductor device and a fabrication method thereof. Particularly, the present invention relates to a semiconductor device having a multilayer interconnection structure of a buried interconnection, and a fabrication method thereof.

2. Description of the Background Art

As the first conventional art of a semiconductor device having a multilayer interconnection structure of a buried interconnection, the semiconductor device disclosed in Japanese Patent Laying-Open No. 9-153545 is taken by way of example. A fabrication method thereof will be described with reference to FIG. 20. Referring to FIG. 20, an interlayer insulation film 102 such as a silicon oxide film is formed by CVD (chemical vapor deposition) on a silicon substrate 101. A lower interconnection 104 is formed on interlayer insulation film 102.

A connection hole stopper film 106 such as a silicon nitride film is formed on interlayer insulation film 102 to cover lower interconnection 104. A lower interlayer insulation film 108 such as a silicon oxide film is formed by CVD and the like on connection hole stopper film 106. Then, an upper trench stopper film 109 such as a silicon nitride film is formed on lower interlayer insulation film 108.

Referring to FIG. 21, a resist pattern 112 is formed on upper trench stopper film 109. Using resist pattern 112 as a mask, upper trench stopper film 109 is subjected to anisotropic etching, whereby a connection hole 113a is formed. Then, resist pattern 112 is removed.

Referring to FIG. 22, an upper interlayer insulation film 110 such as a silicon oxide film is formed by CVD and the like on upper trench stopper film 109 to fill connection hole 13a.

Referring to FIG. 23, a resist pattern 116 is formed on upper interlayer insulation film 110. Using resist pattern 116 as a mask, upper interlayer insulation film 110 is subjected to anisotropic etching, whereby an upper interconnection trench 118 that exposes the surface of upper trench stopper film 109 is formed.

By connection hole 113a formed in upper trench stopper film 109, lower interlayer insulation film 109 is etched at the same time in self-alignment, whereby a connection hole 113b that exposes the surface of connection hole stopper film 106 is formed. Then, resist pattern 116 is removed. By removing connection hole stopper film 106 exposed at the bottom of connection hole 113b, connection hole 113 that exposes the surface of lower interconnection 104 is formed.

Referring to FIG. 24, a conductive layer 120 to establish an upper interconnection is formed on upper interlayer insulation film 110 to fill connection hole 113 and upper interconnection trench 118. Referring to FIG. 25, a CMP (chemical mechanical polishing) process or the like is applied to conductive layer 120, whereby the conductive layer located above the top surface of upper interlayer insulation film 110 is removed to form an upper interconnection 120 in upper interconnection trench 118. Thus, the main part of the multilayer interconnection structure of a buried interconnection is completed in a semiconductor device.

As the second conventional art, the semiconductor device disclosed in Japanese Patent Laying-Open No. 8-335634 is taken by way of example. The fabrication method thereof will be described hereinafter. Referring to FIG. 26, a lower interconnection 104 is formed on a silicon substrate 101. An interlayer insulation film 122 such as a silicon oxide film is formed by CVD or the like on silicon substrate 101 to cover lower interconnection 104. A resist pattern 123 is formed on interlayer insulation film 122.

Referring to FIG. 27, interlayer insulation film 122 is subjected to anisotropic etching with resist pattern 123 as a mask, whereby a connection hole 124 that exposes the surface of lower interconnection 104 is formed. Referring to FIG. 28, an organic compound layer 125 is applied on interlayer insulation film 122 to fill connection hole 124. Desirably, the etching rate of organic compound layer 125 by anisotropic etching in forming an interconnection trench described afterwards is not more than ½ the etching rate of interlayer insulation film 122.

Referring to FIG. 29, organic compound layer 125 located above the top surface of interlayer insulation film 122 is removed, so that organic compound layer 125 remains only in connection hole 124.

Referring to FIG. 30, a resist pattern 126 is formed on interlayer insulation film 122. Referring to FIG. 31, interlayer insulation film 122 is subjected to anisotropic etching with resist pattern 126 as a mask, whereby an upper interconnection trench 118 of a predetermined depth is formed. Referring to FIG. 32, resist pattern 136 and organic compound layer 125 are removed at the same time.

Referring to FIG. 33, a conductive layer (not shown) that becomes the upper interconnection is formed on interlayer insulation film 122 to fill connection hole 124 and upper interconnection trench 118. By applying a CMP process to that conductive layer, the conductive layer located above the top surface of interlayer insulation film 122 is removed, whereby an upper interconnection 120 is formed in upper interconnection trench 118. Thus, the main part of the multilayer interconnection structure of a buried interconnection is completed in a semiconductor device.

The conventional semiconductor device obtained by the abovedescribed fabrication method has problems set forth in the following. The problem of the first conventional art is first described. In the actual device, another upper interconnection (not shown) is located in the proximity of upper interconnection 120 shown in FIG. 25. The two adjacent upper interconnections are both formed right above upper trench stopper film 109. Upper interlayer insulation film 110 is located between respective side surfaces facing each other of the two upper interconnections.

The capacitance between the two adjacent upper interconnections includes the capacitance of upper trench stopper film 109 in addition to the capacitance of upper interlayer insulation film 110. This increase in the capacitance between the interconnections causes degradation in the performance of the semiconductor device.

When an upper layer interconnection (not shown) is to be further provided on upper interconnection 120, a stopper film (not shown) such as a silicon nitride film must be additionally formed right above upper interconnection 120. This means that the capacitance of this stopper film is added to the capacitance between the two adjacent upper interconnections. As a result, the capacitance between the upper interconnections is further increased.

The problem of the second conventional art will be described hereinafter. Upper interconnection trench 118 filled with the upper interconnection is formed in interlayer insulation film 122 at the step shown in FIG. 31. When an upper interconnection trench differing in width from that of upper interconnection trench 118 is to be formed, there is a possibility that the upper interconnection trench of the smaller width will be formed with a depth smaller than that of an upper interconnection trench having a larger trench width. The depth of the upper interconnection trench may vary according to the trench width. This causes variation in the resistance of the upper interconnection filling the upper interconnection trench.

SUMMARY OF THE INVENTION

In view of the foregoing, an object of the present invention is to provide a semiconductor device aimed to reduce interconnection capacitance and variation in interconnection resistance.

Another object of the present invention is to provide a method of fabricating such a semiconductor device.

According to an aspect of the present invention, a semiconductor device includes a semiconductor substrate having a main surface, a first interconnection, an etching stopper film, a first insulation film, a second insulation film, an insulation trench, and a second interconnection. The first interconnection is formed on the semiconductor substrate. The etching stopper film is formed to directly cover the first interconnection. The first insulation film is formed to directly cover the etching stopper film. The second insulation is formed to directly cover the first insulation film. The interconnection trench is formed in the second insulation film to expose the surface of the first insulation film. The second interconnection is formed in that interconnection trench.

According to this semiconductor device, the etching stopper film generally formed of a silicon nitride film and the like is provided only right above the first interconnection. The etching stopper film is not present right under the second interconnection as in the conventional semiconductor device. Therefore, the capacitance according to the etching stopper film does not have to be taken into account in the capacitance of the two adjacent second interconnections. Only the capacitance according to the second insulation film is to be mainly considered. Thus, the capacitance between the two adjacent second interconnections can be reduced than that of the conventional semiconductor device due to the absence of an etching stopper film right under the second interconnection.

Preferably, the second insulation film has a predetermined thickness, and differs from the first insulation film in the etching property.

In this case, the second insulation film can be etched without substantially etching the first insulation film in the formation of the interconnection trench by applying anisotropic etching to the second insulation film. Therefore, the depth of the interconnection trench is substantially constant. Thus, variation in the resistance of the second interconnection formed in the interconnection trench can be reduced.

Specifically, a silicon oxide film formed by plasma CVD can be employed as the above first insulation film. A silicon oxide film formed by a spin-on-glass process can be employed as the second insulation film. A silicon nitride film can be employed as the etching stopper film.

According to another aspect of the present invention, a semiconductor device includes a semiconductor substrate having a main surface, a first interconnection, a conductive etching stopper film, a first insulation film, a second insulation film, a third insulation film, an interconnection trench, and a second interconnection. The first interconnection is formed on the semiconductor substrate. The conductive etching stopper film is formed to directly cover the first interconnection. The insulation film is formed to directly cover the conductive etching stopper film. The second insulation film is formed to directly cover the first insulation film, and has an etching property differing from that of the first insulation film. The third insulation film is formed to directly cover the second insulation film. The interconnection trench is formed in the third insulation film to expose the surface of the second insulation film. The second insulation film is formed in the interconnection trench.

According to this semiconductor device, the conductive etching stopper film is provided only right above the first interconnection. An etching stopper such as a silicon nitride film is not present right under the second interconnection as in the conventional semiconductor device. Therefore, the capacitance corresponding to the etching stopper film does not have to be taking into account in the capacitance of two adjacent second interconnections. Mainly the capacitance corresponding to the third insulation film is to be taken into consideration. Thus, the capacitance between two adjacent second interconnections can be reduced than that of the conventional semiconductor device due to the absence of an etching stopper film right under the second interconnection.

Preferably, the third insulation film has a predetermined thickness, and differs from the second insulation film in etching property.

When the interconnection trench is to be formed by applying anisotropic etching to the third insulation film, the third insulation film can be etched without substantially etching the second insulation film. Therefore, the depth of the interconnection trench becomes substantially constant. Thus, variation in the resistance of the second interconnection formed in that interconnection trench can be reduced.

Specifically, a silicon oxide film formed by the spin-on-glass process can be employed as the above third insulation film. A silicon oxide film formed by plasma CVD can be employed as the second insulation film.

Furthermore, a copper interconnection can be employed as the first interconnection and the second interconnection.

According to a further aspect of the present invention, a fabrication method of a semiconductor device includes the steps of: forming a first interconnection on a semiconductor substrate having a main surface, forming an etching stopper film to directly cover the first interconnection, forming a first insulation film to directly cover the etching stopper film, forming a second insulation film of a predetermined thickness differing from the first insulation in etching property to directly cover the first insulation film, forming a resist pattern on the second insulation film, forming an interconnection trench exposing the surface of the first insulation film by applying anisotropic etching to the second insulation film with the resist pattern as a mask, and forming a second interconnection in that interconnection trench.

According to this fabrication method, an etching stopper film such as a silicon nitride film is formed only right above the first interconnection. An etching stopper is not formed right under a second interconnection as in a conventional semiconductor device. Therefore, the capacitance between adjacent interconnections can be reduced than that of the conventional semiconductor device due to the absence of an etching stopper film right under the second interconnection. Since an etching stopper film does not have to be formed right under the second interconnection, the number of steps of the fabrication can be reduced.

Preferably, the etching rate of the first insulation film by the anisotropic etching in forming an interconnection trench is not more than ½ the etching rate of the second insulation film.

In this case, the second insulation film can be etched without substantially etching the first insulation film. As a result, the depth of the interconnection trench is substantially constant. Thus, variation in the resistance of the second interconnection formed in the interconnection trench can be reduced.

Preferably, the fabrication method includes the steps of forming a resist pattern on the first insulation film after formation of the first insulation film, forming an opening exposing the surface of the etching stopper film by applying anisotropic etching to the first insulation film with the resist pattern as a mask, and forming a connection hole to electrically connect the first and second interconnections by removing the etching stopper film exposed at the bottom of the opening to expose the surface of the first interconnection, after formation of the interconnection trench.

In this case, etching is to be carried out corresponding to only the thickness of the first insulation film as an opening for the formation of a connection hole. The film thickness of the resist pattern formed on the insulation film can be set thinner. As a result, the accuracy of photolithography to form the resist pattern can be improved.

Preferably, the etching rate of the etching stopper film by the anisotropic etching in forming an opening is not more than $\frac{1}{5}$ the etching rate of the first insulation film.

In this case, damage on the first interconnection can be suppressed by virtue of the first insulation film being etched, without the etching stopper film being substantially etched in the formation of the opening. Furthermore, the first interconnection is not oxidized in removing the resist pattern used in the formation of an opening and in the formation of an interconnection trench by, for example, oxygen plasma.

Specifically, a silicon oxide film formed by plasma CVD can be employed as the above first insulation film. A silicon oxide film formed by the spin-on-glass process can be employed as the second insulation film.

According to still another aspect of the present invention, a fabrication method of a semiconductor device includes the steps of: forming a first interconnection on a semiconductor substrate having a main surface, forming a conductive etching stopper film to directly cover the first interconnection; forming a first insulation film to directly cover the conductive etching stopper film; forming a second insulation film to directly cover the first insulation film, differing in etching property from the first insulation film; forming a third insulation film of a predetermined thickness to directly cover the second insulation film, the etching property of the third insulation film differing from that of the second insulation film; forming an interconnection trench exposing the surface of the second insulation film by applying anisotropic etching on the third insulation film; and forming a second interconnection in that interconnection trench.

According to this fabrication method, the conductive etching stopper film is formed only right above the first interconnection. An etching stopper film such as of a silicon nitride film will not be formed right under the second interconnection as in a conventional semiconductor device. Therefore, the capacitance between two adjacent second interconnections can be reduced due to the absence of an etching stopper film right under the second interconnection, in comparison to the conventional semiconductor device. Since an etching stopper film does not have to be formed right under the second interconnection, the number of fabrication steps can be reduced.

Preferably, the etching rate of the second insulation film by anisotropic etching in forming the interconnection trench is not more than $\frac{1}{2}$ the etching rate of the third insulation film.

In this case, the third insulation film can be etched without substantially etching the second insulation film. Therefore, the depth of the interconnection trench can be set substantially constant. Thus, variation in the resistance of the second interconnection formed within the interconnection trench can be reduced.

Preferably, the fabrication method includes the steps of forming a fourth insulation film to directly cover the third insulation film having an etching property differing from that of the third insulation film, and forming a connection hole in the first and second insulation films, electrically connecting the first and second interconnections. The step of forming a connection hole includes the steps of forming a resist pattern on the fourth insulation film, and forming a connection hole partially by applying anisotropic etching to the second insulation film partway with the resist pattern as a mask and forming a connection hole and exposing the surface of the conductive etching stopper film to by applying anisotropic etching simultaneously to the second insulation film or the first insulation film exposed at the bottom of the partially formed connection hole partway in the second insulation film, and to the third insulation film, in the formation of the interconnection trench in the third insulation film.

In this case, the connection hole is formed only partway in the second insulation film when the resist pattern on the fourth insulation film is removed by, for example, oxygen plasma. Therefore, the first interconnection can be prevented from being oxidized.

Specifically, a silicon oxide film formed by spin-on-glass process can be employed as the above first insulation film and third insulation film. A silicon oxide film formed by plasma CVD can be employed as the second insulation film and fourth insulation film.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
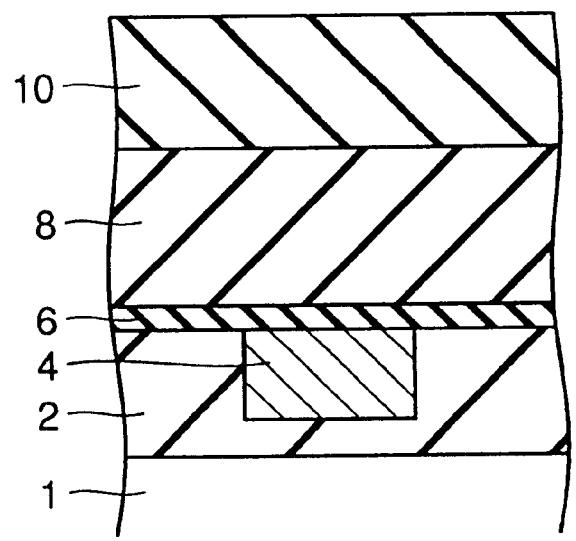
FIG. 1 is a sectional view of a semiconductor device according to a first embodiment of the present invention showing a step of the fabrication method thereof.

A semiconductor device according to a first embodiment of the present invention and a fabrication method thereof will be described hereinafter. Referring to FIG. 1, an interlayer insulation film 2 of 300–1500 nm in thickness such as a silicon oxide film is formed by CVD or the like on a silicon substrate 1. A lower interconnection 4 of 300–1500 nm in thickness is formed in interlayer insulation film 2. A connection hole stopper film 6 of 30–150 nm in thickness such as a silicon nitride film functioning as an etching stopper film is formed by, for example, plasma CVD, to directly cover lower interconnection 4.

A lower interlayer insulation film 8 of 300–1500 nm in thickness such as a silicon oxide film corresponding to the first insulation film is formed by, for example, plasma CVD, to directly cover connection hole stopper film 6. A silicon oxide film of the TEOS (Tetra Ethyl Ortho Silicate Glass) type is preferable as this lower interlayer insulation film 8. An upper interlayer insulation film 10 of 300–1500 nm in thickness such as a silicon oxide film is formed as the second insulation film by, for example, a spin-on-glass process on lower interlayer insulation film 8.

Figure 2:
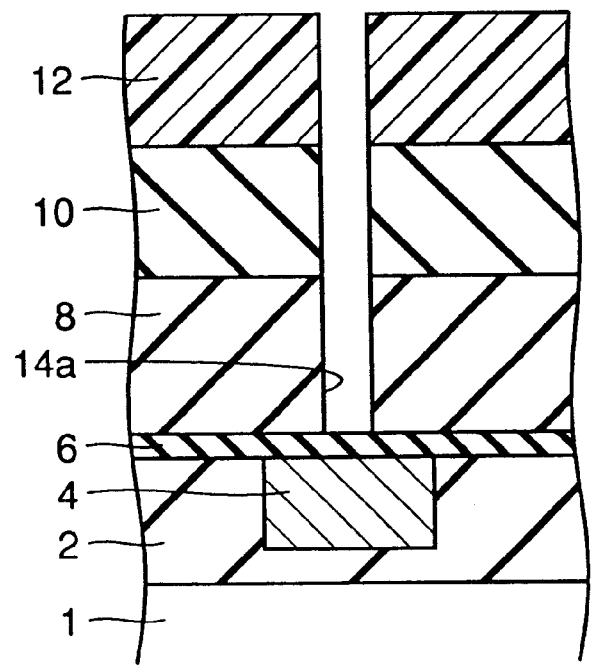
FIG. 2 is a sectional view of the semiconductor device of the first embodiment showing a step carried out subsequent to the step of FIG. 1.

Referring to FIG. 2, a resist pattern 12 is formed on upper interlayer insulation film 10. Using this resist pattern 12 as a mask, upper interlayer insulation film 10 and lower interlayer insulation film 8 are subjected to anisotropic etching, whereby a connection hole 14a exposing the surface of connection hole stopper film 6 is formed.

In this case, upper interlayer insulation film 10 and lower interlayer insulation film 8 are etched preferably in a plasma atmosphere in which mixture gas including $C_4F_8$, $O_2$ and Ar is converted into plasma using an ECR type RIE apparatus as a dry etching device. Under this etching condition, the etching rate of connection hole stopper film 6 by anisotropic etching is approximately 1/20 the etching rate of lower interlayer insulation film 8.

Under this etching condition, the etching rate of lower interlayer insulation film 8 is approximately 1/1.2 the etching rate of upper interlayer insulation film 10. Therefore, there is no problem in the formation of connection hole 14a. Then, resist pattern 12 is removed in, for example, oxygen plasma atmosphere.

Figure 3:
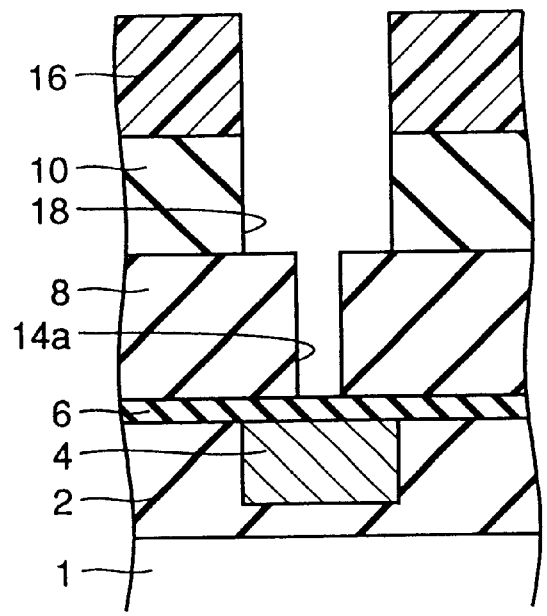
FIG. 3 is a sectional view of the semiconductor device of the first embodiment showing a step carried out subsequent to the step of FIG. 2.

Referring to FIG. 3, a resist pattern 16 is formed on upper interlayer insulation film 10. Upper interlayer insulation film 10 is subjected to anisotropic etching with resist pattern 16 as a mask, whereby an upper interconnection trench 18 exposing the surface of lower interlayer insulation film 8 is formed.

Here, mixture gas including $C_4F_8$, $CHF_3$, CO and Ar is converted into plasma, and etching is applied to upper interlayer insulation film 10 in that plasma atmosphere using an ECR type RIE apparatus as the dry etching device. In this etching condition, the etching rate of lower interlayer insulation film 8 by the anisotropic etching is approximately ½ the etching rate of upper interlayer insulation film 10. Upper interlayer insulation film 10 can be etched without substantially etching lower interlayer insulation film 8.

Thus, upper interconnection trench 10 can be formed with a constant depth corresponding to the thickness of upper interlayer insulation film 10 without depending upon the width of the interconnection trench. Furthermore, connection hole stopper film 6 is hardly etched in this etching process.

Then, resist pattern 16 is removed in, for example, oxygen plasma atmosphere. Here, lower interconnection 4 can be prevented from being oxidized by virtue of being covered by connection hole stopper film 6. Then, mixture gas including $CF_4$, $O_2$ and Ar is converted into plasma, and connection hole stopper film 6 exposed at the bottom of connection hole 14a is etched in that plasma atmosphere. As a result, connection hole stopper film 6 is removed to expose the surface of lower interconnection 4.

Figure 4:
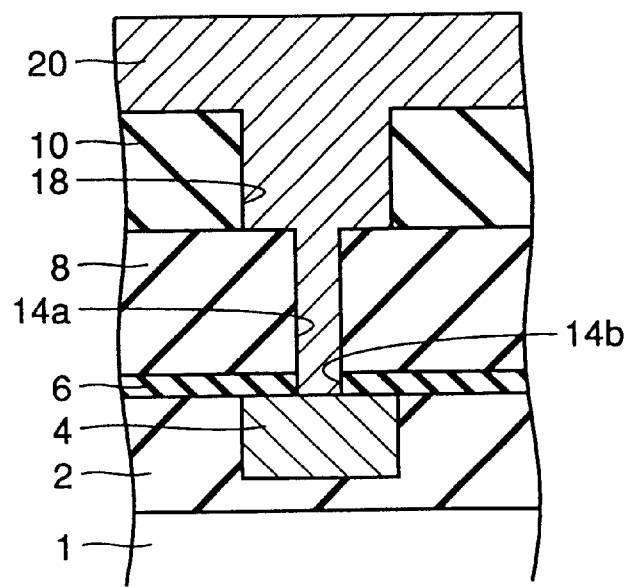
FIG. 4 is a sectional view of the semiconductor device of the first embodiment showing a step carried out subsequent to the step of FIG. 3.
Figure 5:
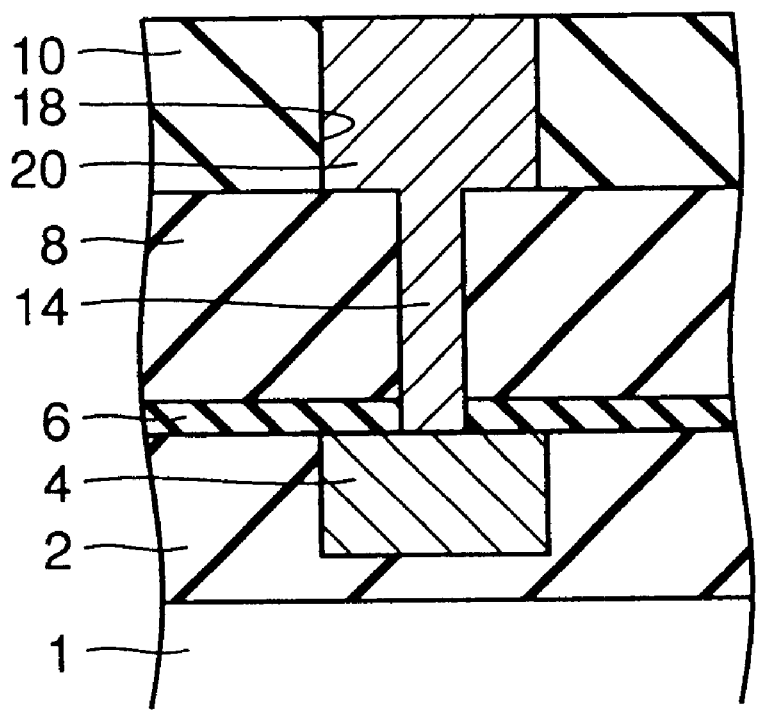
FIG. 5 is a sectional view of the semiconductor device of the first embodiment showing a step carried out subsequent to the step of FIG. 4.

Referring to FIG. 4, a conductive layer 20 corresponding to the upper interconnection is formed on upper interlayer insulation film 10 to fill the upper interconnection trench and connection holes 14a and 14b. Referring to FIG. 5, a CMP process is applied, whereby conductive layer 20 located above the top surface of upper interlayer insulation film 10 is removed. As a result, an upper interconnection 20 is located in upper interconnection trench 18. Thus, the main part of the multilayer interconnection structure of a buried interconnection is completed in a semiconductor device.

In the above semiconductor device having a multilayer interconnection structure, the stopper film of a silicon nitride film or the like is provided only right above lower interconnection 4. A stopper film is not present right under upper interconnection 20 as in the conventional semiconductor device. It is therefore not necessary to take into account the capacitance corresponding to the stopper film in the capacitance between two adjacent upper interconnections. Mainly the capacitance corresponding to upper interlayer insulation film 10 is to be taken into account. Thus, the capacitance between adjacent upper interconnections can be reduced than that of the conventional semiconductor device due to the absence of a stopper film right under upper interconnection 20.

Figure 6:
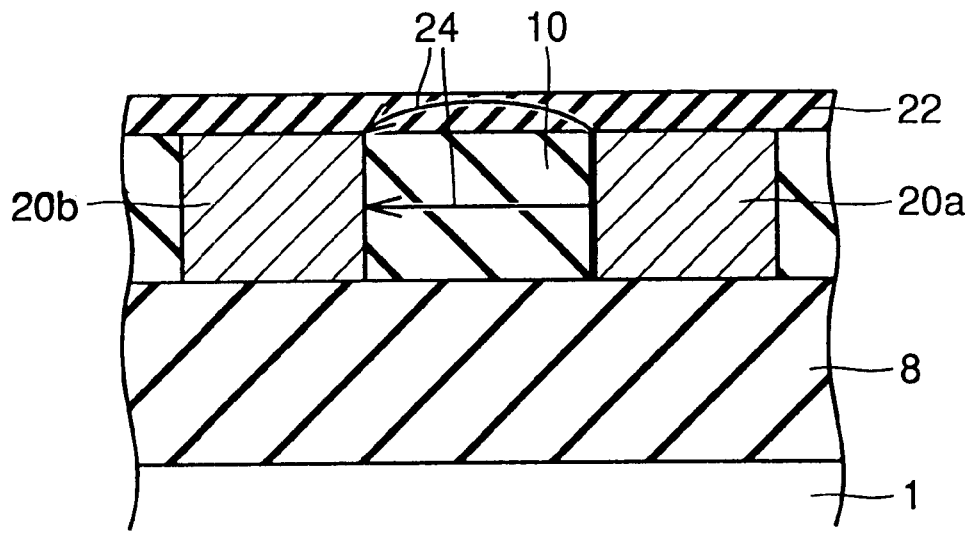
FIG. 6 schematically shows a structure to estimate the capacitance between adjacent upper interconnections in the semiconductor device of the first embodiment.

Details will be provided hereinafter. FIG. 6 shows a structure of a semiconductor device expected to have another upper interconnection formed on two adjacent upper interconnections 20a and 20b. Therefore, a connection hole stopper film 22 is formed right above upper interconnections 20a and 20b to directly cover the same.

Figure 7:
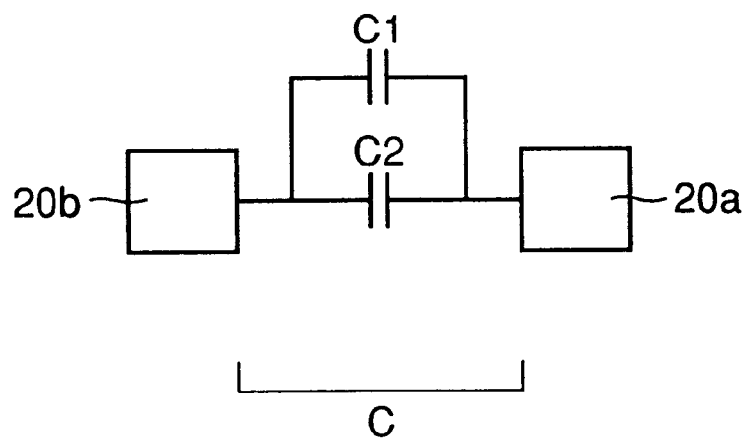
FIG. 7 shows the capacitance between interconnections according to the structure of FIG. 6.

Consider the capacitance between the two adjacent upper interconnections 20a and 20b in such a structure. As an approximation of order 0, consider the component of an electric line of force 24 from the side (bold line) of upper interconnection 20a closer to upper interconnection 20b. The unit length corresponds to the direction perpendicular to the drawing sheet of the side portion of upper interconnection 20a. As shown in FIG. 7, let the capacitance corresponding to connection hole stopper film 22 be C1, the capacitance corresponding to upper interlayer insulation film 10 be C2, and the capacitance between upper interconnections 20a and 20b be C. Therefore, the following equation is provided.

$$C = C1 + C2 \quad (1)$$

Here, $C1 = \in_1 \times S1/d$, $C2 = \in_2 \times S2/d$, where d is the distance between adjacent upper interconnections.

When a silicon nitride film of film thickness $S1 = 0.06\ \mu m$ and dielectric constant $\in_1 = 9$ is employed as connection hole stopper film 22, and a TEOS type silicon oxide film of film thickness $S2 = 0.6\ \mu m$ and the dielectric constant $\in_2 = 3.5$ is employed as upper interlayer insulation film 10, capacitance C between interconnections becomes:

$$C = 2.64/D \quad (2)$$

Figure 8:
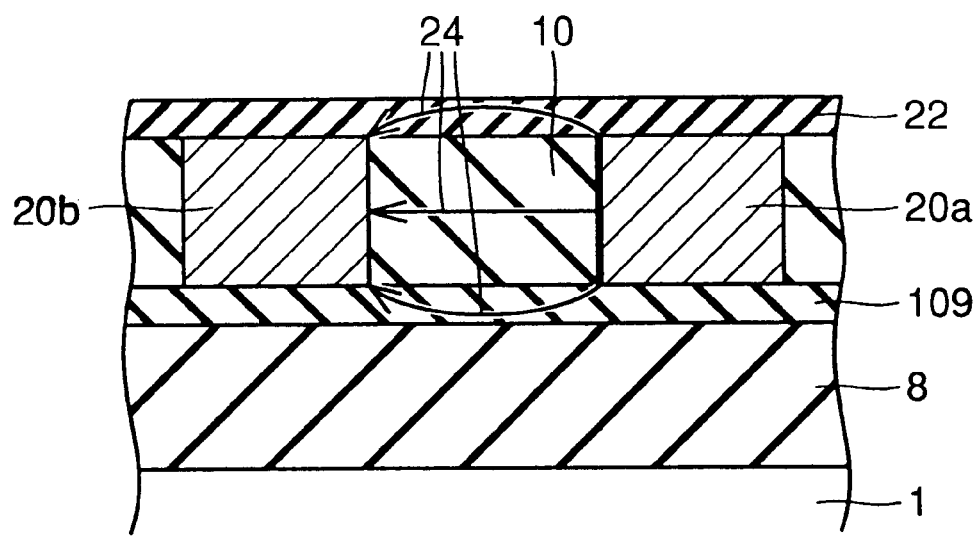
FIG. 8 schematically shows a structure to estimate the capacitance between upper interconnections in a conventional semiconductor device for comparison with the first embodiment.
Figure 9:
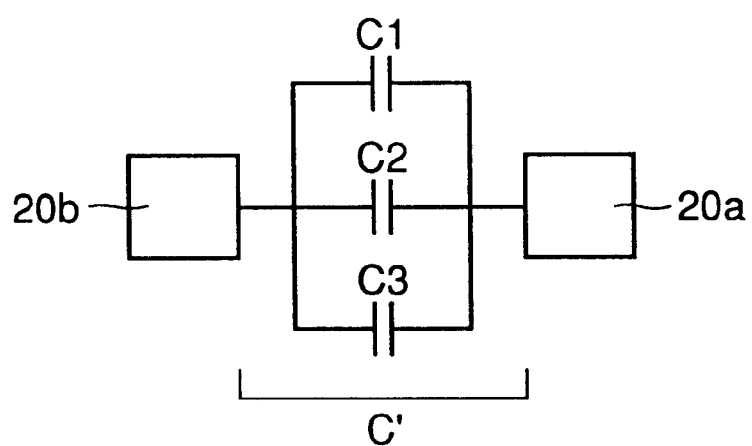
FIG. 9 shows the capacitance between interconnections according to the structure of FIG. 8.

For the sake of comparison, the capacitance for a conventional semiconductor device will be described hereinafter. Referring to FIG. 8, an upper trench stopper film 109 is present right under two adjacent upper interconnections 20a and 20b. Therefore, capacitance C' between two adjacent upper interconnections 20a and 20b includes capacitance C3 corresponding to upper trench stopper film 109 in addition to the above capacitance C1 and C2. Therefore, capacitance C' is:

$$C' = C1 + C2 + C3 \quad (3)$$

Here, $C1 = \in_3 \times S3/d$.

When a silicon nitride film of film thickness $S3 = 0.06\ \mu m$ and dielectric constant $\in_3 = 9$ is employed as upper trench stopper film 109, capacitance C' between adjacent upper interconnections 20a and 20b becomes:

$$C' = 3.18/d \quad (4)$$

By comparing (2) and (4), it is appreciated that the capacitance between two adjacent upper interconnections 20a and 20b can be reduced to approximately 83% the conventional capacitance by the semiconductor device of the present embodiment.

In the above, the component of the electric line of force from the side face of upper interconnection 20a is considered as the approximation of order 0. The component of the electric line of force from the bottom of upper interconnection 20a must also be considered in order to improve the approximation. When the capacitance is estimated taking into consideration the component thereof, the difference in capacitance between the semiconductor device of the present invention and the conventional semiconductor device becomes greater.

As previously described, the capacitance between two adjacent upper interconnections 20a and 20b can be reduced since an upper trench stopper film such as a silicon nitride film is not present light under upper interconnection 20a in the semiconductor device of the present embodiment. Since the upper trench stopper film does not have to be formed, the number of steps of the fabrication method can be reduced. Thus, the fabrication cost can be reduced.

In the present embodiment, a TEOS type silicon oxide film is employed as lower interlayer insulation film 8, and a silicon oxide film formed by the spin-on-glass process is employed as upper interlayer insulation film 10. However, the films are not limited to those described above. Other films can be employed as long as the etching rate of lower interlayer insulation film 8 is not more than ½ the etching rate of upper interlayer insulation film 10 by the etching condition in forming upper interconnection trench 18 in order to form an upper interconnection trench having a depth corresponding to the film thickness of upper interlayer insulation film 10.

Furthermore, a silicon nitride film is used as connection hole stopper film 6. However, other films can be employed for connection hole stopper film 6 as long as the etching rate of connection hole stopper film 6 is not more than ⅕ the etching rate of lower interlayer insulation film 8 by the anisotropic etching in forming connection hole 14a to suppress the lower interconnection from being oxidized in removing the resist patterns used in the formation of connection hole 14a and upper interconnection trench 18 in an oxygen plasma atmosphere.

Second Embodiment

Figure 10:
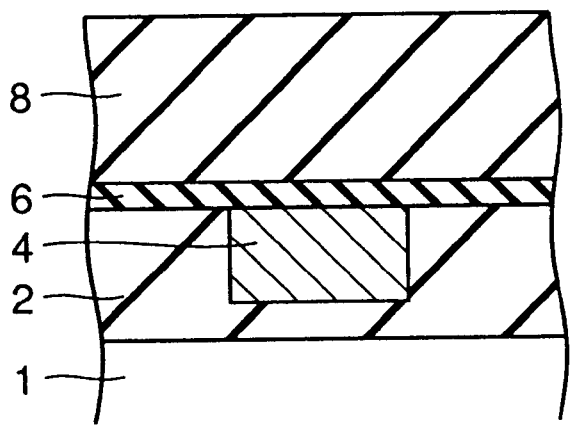
FIG. 10 is a sectional view of a semiconductor device according to a second embodiment of the present invention showing a step of the fabrication method thereof.
Figure 11:
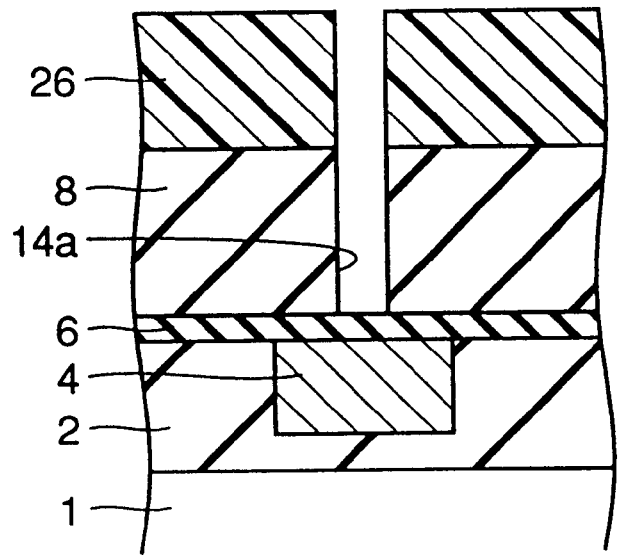
FIG. 11 is a sectional view of the semiconductor device of the second embodiment showing a step carried out subsequent to the step of FIG. 10.

A semiconductor device according to a second embodiment of the present invention and a fabrication method thereof will be described hereinafter. The fabrication preceding the step shown in FIG. 10 is similar to the fabrication up to the formation of lower interlayer insulation film 8 shown in FIG. 1 of the first embodiment. Therefore, detailed description thereof will not be repeated. Referring to FIG. 11, a resist pattern 26 is formed on lower interlayer insulation film 8. Using this resist pattern 26 as a mask, lower interlayer insulation film 8 is subjected to anisotropic etching, whereby a connection hole 14a exposing the surface of connection hole stopper film 6 is formed.

Mixture gas including $C_4F_8$, $O_2$ and Ar is converted into plasma and silicon substrate 1 is placed in that plasma atmosphere to etch lower interlayer insulation film 8 using an ECR type RIE device as the dry etching device. In the etching condition, the etching rate of connection hole stopper film 6 by anisotropic etching is approximately 1/20 the etching rate of lower interlayer insulation film 8. Therefore, connection hole stopper film 6 is hardly etched. Then, resist pattern 26 is removed in, for example, oxygen plasma atmosphere.

Figure 12:
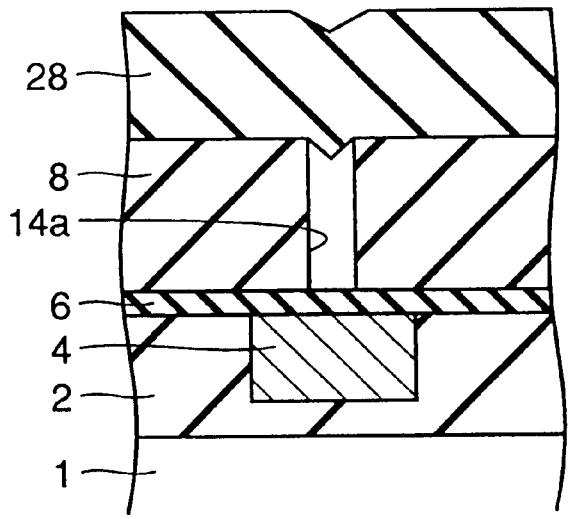
FIG. 12 is a sectional view of the semiconductor device of the second embodiment showing a step carried out subsequent to the step of FIG. 11.

Referring to FIG. 12, an upper interlayer insulation film 28 is formed by the spin-on-glass process to close the opening end of connection hole 14a formed in lower interlayer insulation film 8. Here, the viscosity of the material of upper interlayer insulation film 28 is desirably at least 0.7 mPa·s. If the material has such viscosity and the opening diameter of connection hole 14a is not more than 0.4 μm, upper interlayer insulation film 28 can be formed on lower interlayer insulation film 8 to block the opening end of connection hole 14a without filling the interior of connection hole 14a.

Figure 13:
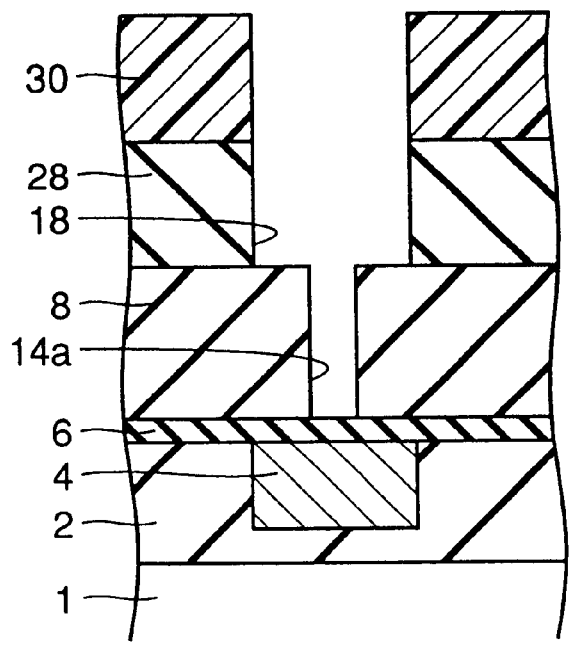
FIG. 13 is a sectional view of the semiconductor device of the second embodiment showing a step carried out subsequent to the step of FIG. 12.

Referring to FIG. 13, a resist pattern 30 is formed on upper interlayer insulation film 28. Using that resist pattern 30 as a mask, upper interlayer insulation film 28 is subjected to anisotropic etching, whereby an upper interconnection trench 18 exposing the surface of lower interlayer insulation film 8 is formed.

Here, mixture gas including $C_4F_8$, $CHF_3$, CO and Ar is converted into plasma, and upper interlayer insulation film 28 is etched in that plasma atmosphere using an ECR type RIE device as a dry etching device. At this etching condition, the etching rate of lower interlayer insulation film 8 by anisotropic etching can be set approximately 1/3 the etching rate of upper interlayer insulation film 28. Upper interlayer insulation film 28 can be etched without substantially etching lower interlayer insulation film 8.

Accordingly, upper interconnection trench 18 can be formed with a constant depth corresponding to the thickness of upper interlayer insulation film 28, not dependent on the width of the interconnection trench. At this etching condition, connection hole stopper film 6 exposed at the bottom of connection hole 14a is hardly etched.

Figure 14:
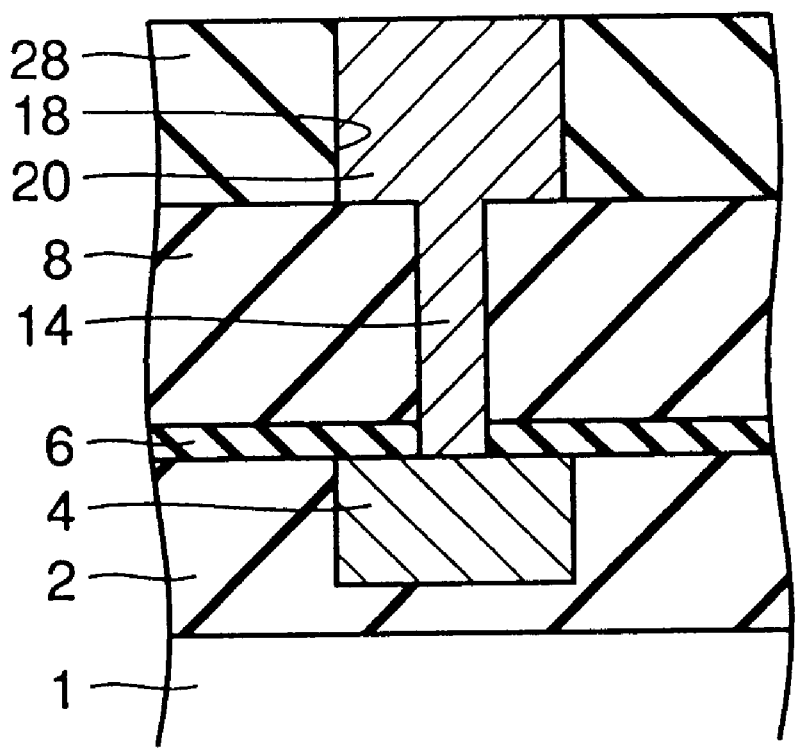
FIG. 14 is a sectional view of the semiconductor device of the second embodiment showing step carried out subsequent to the step of FIG. 13.

Then, steps similar to those shown in FIGS. 3–5 described in the first embodiment are carried out to result in the structure shown in FIG. 14. Thus, the main part of the multilayer interconnection structure constituted by buried interconnections is completed in the semiconductor device.

In the semiconductor device formed according to the above-described fabrication method, the connection hole stopper film such as a silicon nitride film is provided only right above lower interconnection 4, as in the first embodiment. There is no upper trench stopper film right under upper interconnection 20 as in a conventional semiconductor device. It is therefore not necessary to take into account the capacitance corresponding to the upper trench stopper film in the capacitance between two adjacent upper interconnections. Mainly the capacitance corresponding to upper interlayer insulation film 28 is to be taken into account. As a result, the capacitance between adjacent upper interconnections 20 can be reduced than that of the conventional semiconductor device, as previously described in the first embodiment.

Since it is not necessary to form an etching stopper film right under upper interconnection 20, the number of fabrication steps can be reduced to lower the fabrication cost.

In the previous first embodiment, connection hole 14a had to be etched to a depth corresponding to the thickness of upper interlayer insulation film 10 and lower interlayer insulation film 8. In the present embodiment, etching to a depth corresponding to the thickness of only lower interlayer insulation film 8 is required, as shown in FIG. 11. Therefore, resist pattern 26 on lower interlayer insulation film 8 can be formed more thinner. This provides the advantage that the accuracy of photolithography is improved.

In the present embodiment, a TEOS type silicon oxide film is employed as lower interlayer insulation film 8, and a silicon oxide film formed by a spin-on-glass process is employed as upper interlayer insulation film 28. However, other films can be employed as long as the etching rate of lower interlayer insulation film 8 is not more than ½ the etching rate of upper interlayer insulation film 28 under the etching condition in the formation of upper interconnection trench 18 in order to form an upper interconnection trench having a depth corresponding to the film thickness of the upper interlayer insulation film.

A silicon nitride film is employed as connection hole stopper film 6. However, a film other than a silicon nitride film can be employed as long as the etching rate of connection hole stopper film 6 is not more than 1/5 the etching rate of lower interlayer insulation film 8 by the anisotropic etching in the formation of connection hole 14a in order to prevent the lower interconnection from being oxidized in the event of removing the resist pattern in an oxygen plasma atmosphere during the formation of connection hole 14a or upper interconnection trench 18.

Third Embodiment

Figure 15:
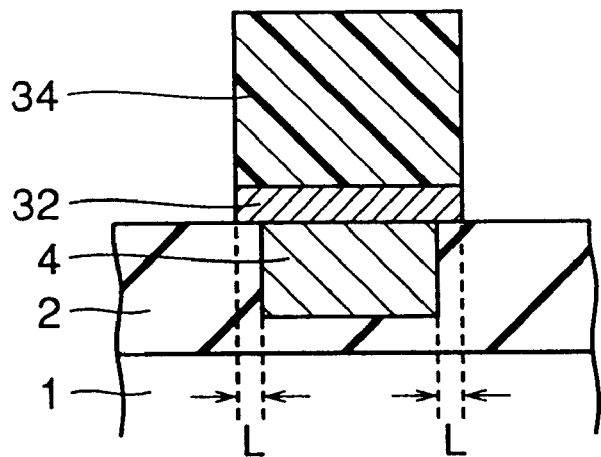
FIG. 15 is a sectional view of a semiconductor device according to a third embodiment of the present invention showing a step of the fabrication method thereof.

A fabrication method of a semiconductor device according to a third embodiment of the present invention, and a semiconductor device obtained therefrom will be described hereinafter. Referring to FIG. 15, an interlayer insulation film 2 of 300–1500 nm in thickness such as a silicon oxide film is formed by CVD or the like on a silicon substrate 1. A lower interconnection 4 of 300–1500 nm in thickness is formed at interlayer insulation film 2. A TiN barrier layer (not shown) functioning as a conductive etching stopper film is formed by, for example, sputtering on interlayer insulation film 2 to directly cover lower interconnection 4. A resist pattern 34 is formed on that TiN barrier layer. Using resist pattern 34 as a mask, a TiN barrier film 32 is formed by applying anisotropic etching process to the TiN barrier layer.

Desirably, the film thickness of TiN barrier film 32 is at least 150 nm. Also, it is desired that TiN barrier film 32 has a width greater than that of lower interconnection 4 and a length L of at least 200 nm. This TiN film functions to suppress the metal in lower interconnection 4 from diffusing into a lower SOG film 36 and the like that will be described afterwards. Then, resist pattern 34 is removed in, for example, oxygen plasma atmosphere.

Figure 16:
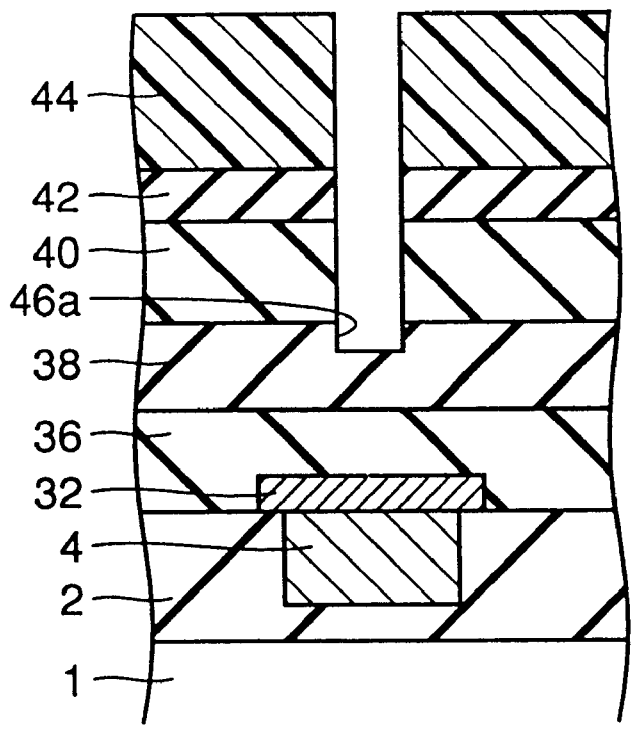
FIG. 16 is a sectional view of the semiconductor device of the third embodiment showing a step carried out subsequent to the step of FIG. 15.

Referring to FIG. 16, a lower SOG film 36 such as a silicon oxide film is formed to a thickness of 150–1000 nm by a spin-on-glass process on interlayer insulation film 2 to directly cover TiN barrier film 32. A lower TEOS film 38 is formed to a thickness of 150–500 nm by, for example, plasma CVD, to directly cover lower SOG film 36. An upper SOG film 40 is formed to a film thickness of 300–1400 nm such as a silicon oxide film by a spin-on-glass process to directly cover lower TEOS film 38. An upper TEOS film 42 is formed to a thickness of 50–200 nm by plasma CVD or the like to directly cover upper SOG film 40.

A resist pattern 44 is formed on upper TEOS film 42. Using resist pattern 44 as a mask, upper TEOS film 42, upper SOG film 40 and lower TEOS film 38 are subjected to anisotropic etching to form a connection hole 46a.

Mixture gas including $C_4F_8$, $O_2$ and Ar is converted into plasma, and lower TEOS film 38 is etched partway in that plasma atmosphere using an ECR type RIE device as an etching device. Resist pattern 44 is removed in, for example, an oxygen plasma atmosphere.

At the current stage, connection hole 46a is formed by etching only partway in lower TEOS film 38. Therefore, TiN barrier film 32 and lower interconnection 4 can be prevented from being oxidized by the oxygen plasma.

Figure 17:
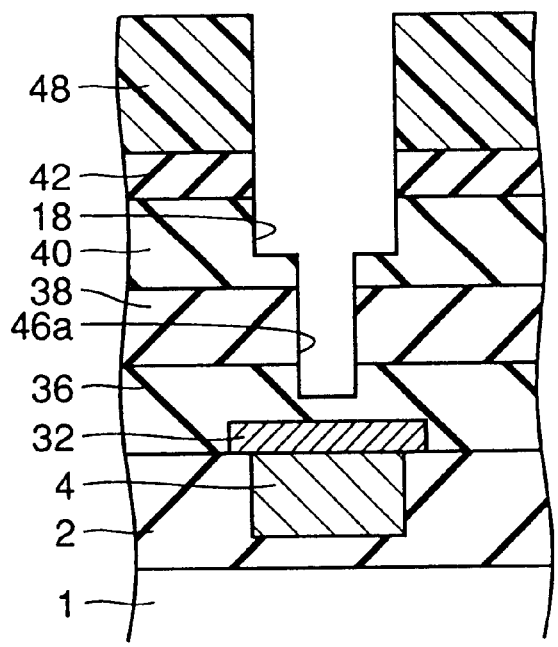
FIG. 17 is a sectional view of the semiconductor device of the third embodiment showing a step carried out subsequent to the step of FIG. 16.

Referring to FIG. 17, a resist pattern 48 is formed on upper TEOS film 42. Using resist pattern 48 as a mask, upper TEOS film 42 and upper SOG film 40 are subjected to anisotropic etching, whereby an upper interconnection trench 18 is partially formed partway in upper SOG film 40. Here, lower TEOS film 38 exposed at the bottom of connection hole 46a partially formed in lower TEOS film 38 is further etched to form an opening partway in lower SOG film 36. Then, resist pattern 48 is removed in, for example, an oxygen plasma atmosphere.

Since connection hole 46a is etched only partway in lower SOG film 36, TiN barrier film 32 and lower interconnection 4 can be prevented from being oxidized by this oxygen plasma.

Figure 18:
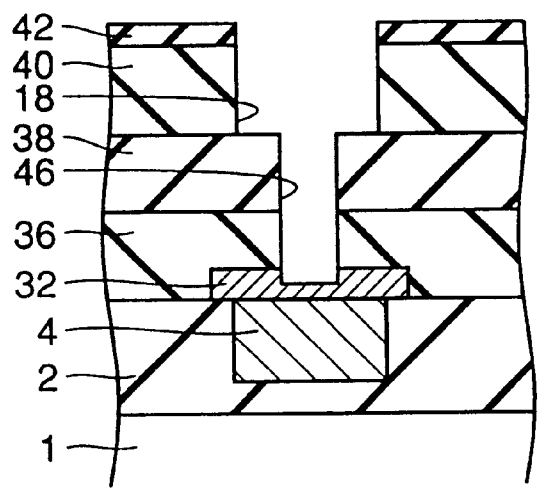
FIG. 18 is a sectional view of the semiconductor device of the third embodiment showing a step carried out subsequent to the step of FIG. 17.

Referring to FIG. 18, silicon substrate 1 is entirely subjected to dry etchback, whereby an upper interconnection trench 18 exposing the surface of lower TEOS film 38 is formed. At the same time, a connection hole 46 exposing the surface of TiN barrier film 32 is formed. Here, mixture gas including $C_4F_8$, $CHF_3$, CO and Ar is converted into plasma in which etching is carried out using an ECR type RIE device as an etching device.

Figure 19:
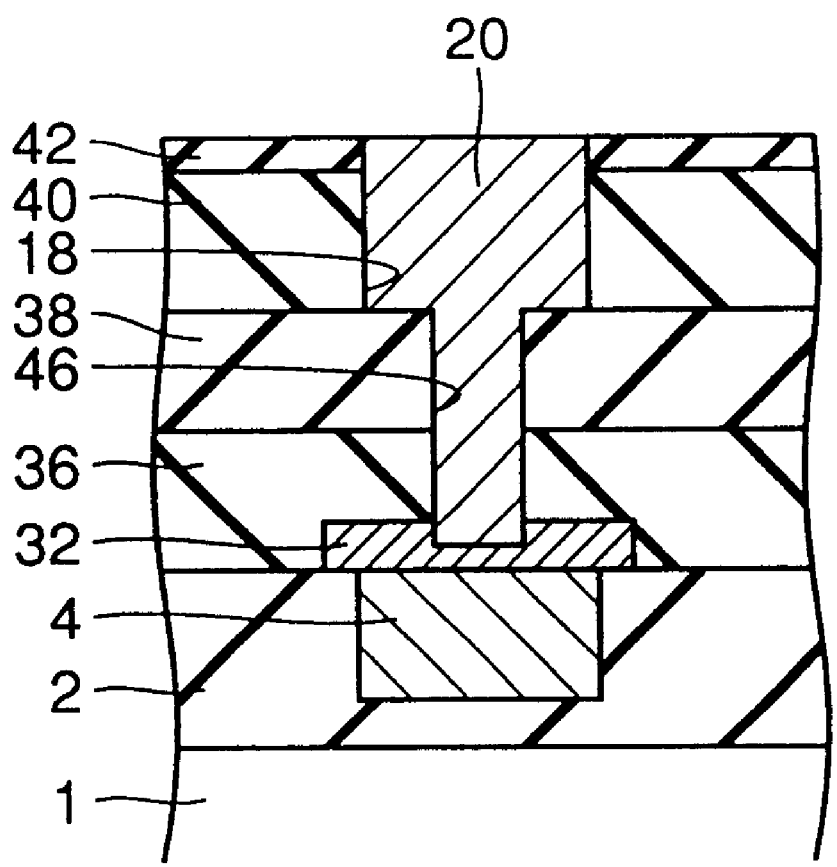
FIG. 19 is a sectional view of the semiconductor device of the third embodiment showing a step carried out subsequent to the step of FIG. 18.
Figure 20:
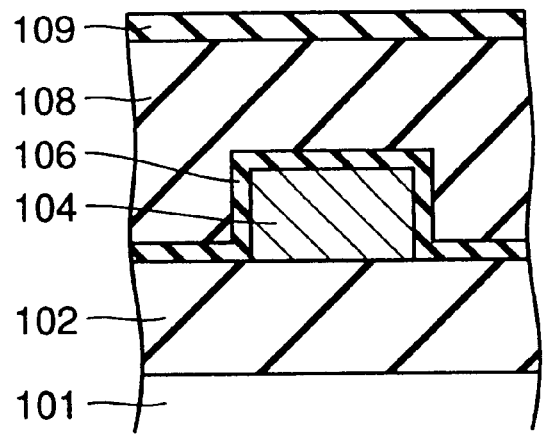
FIG. 20 is a sectional view of a semiconductor device according to the first conventional art showing a step of a fabrication method thereof.
Figure 21:
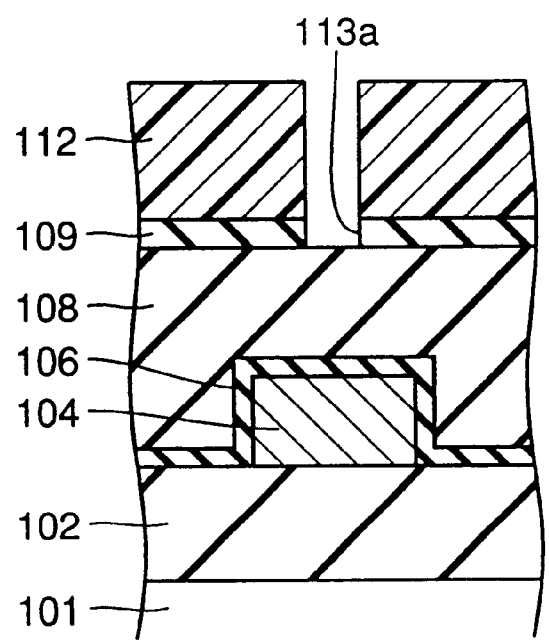
FIG. 21 is a sectional view of the semiconductor device of the first conventional art showing a step carried out subsequent to the step of FIG. 20.
Figure 22:
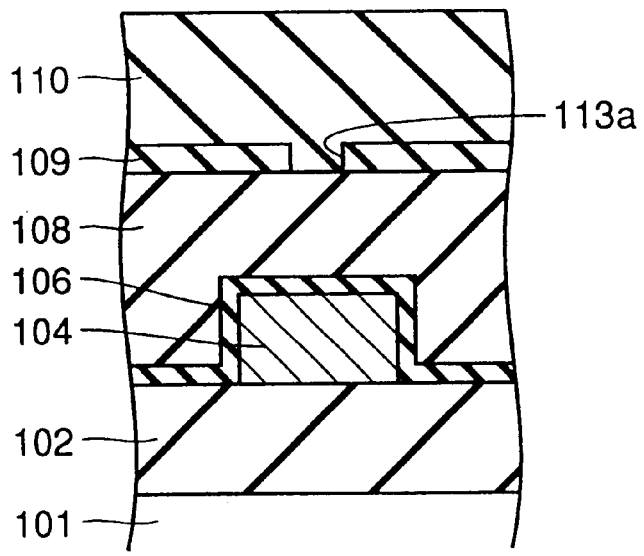
FIG. 22 is a sectional view of the semiconductor device of the first conventional art showing a step carried out subsequent to the step of FIG. 21.
Figure 23:
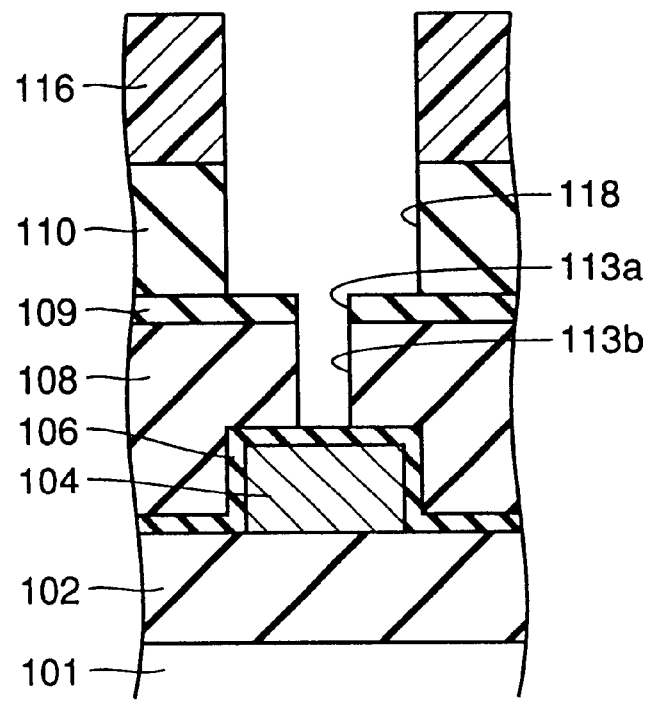
FIG. 23 is a sectional view of the semiconductor device of the first conventional art showing a step carried out subsequent to the step of FIG. 22.
Figure 24:
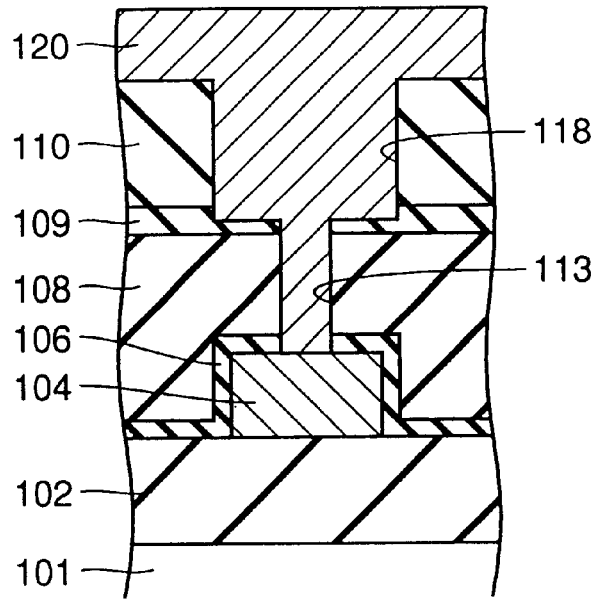
FIG. 24 is a sectional view of the semiconductor device of the first conventional art showing a step carried out subsequent to the step of FIG. 23.
Figure 25:
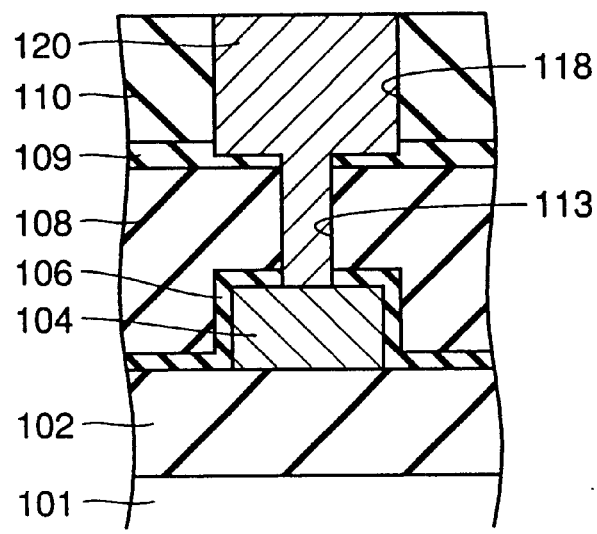
FIG. 25 is a sectional view of the semiconductor device of the first conventional art showing a step carried out subsequent to the step of FIG. 24.
Figure 26:
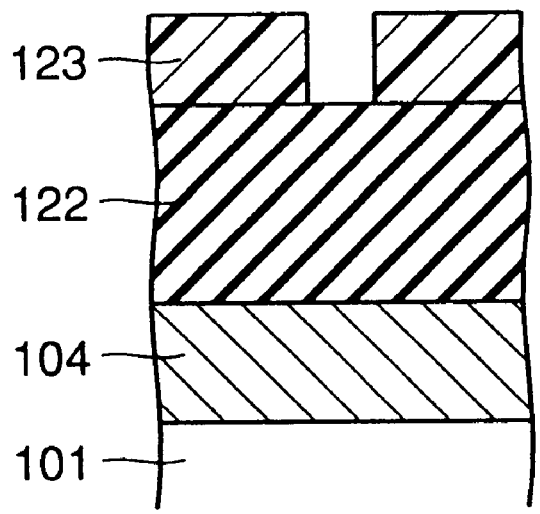
FIG. 26 is sectional view of a semiconductor device according to the second conventional art showing a step of a fabrication method thereof.
Figure 27:
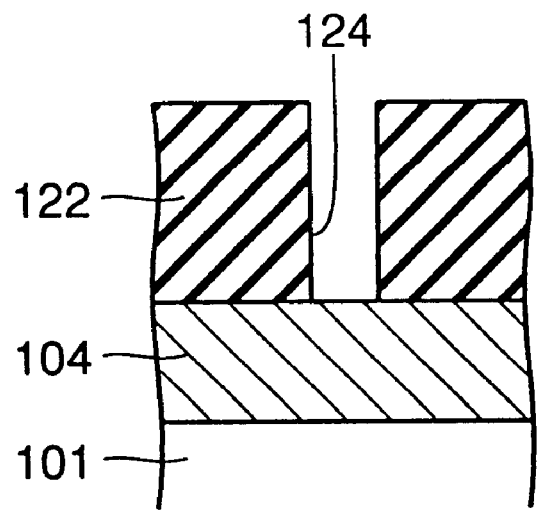
FIG. 27 is a sectional view of the semiconductor device of the second conventional art showing a step carried out subsequent to the step of FIG. 26.
Figure 28:
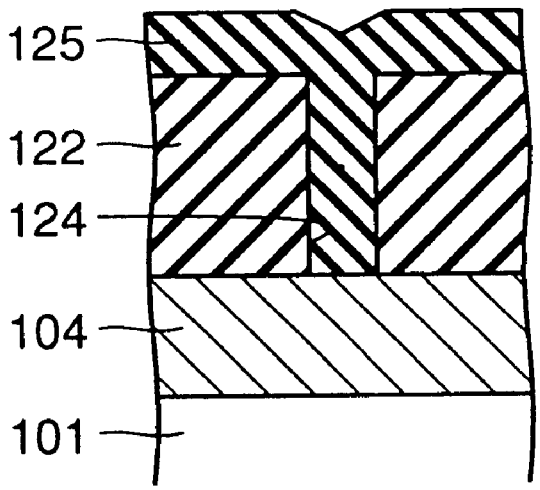
FIG. 28 is a sectional view of the semiconductor device of the second conventional art showing a step carried out subsequent to the step of FIG. 27.
Figure 29:
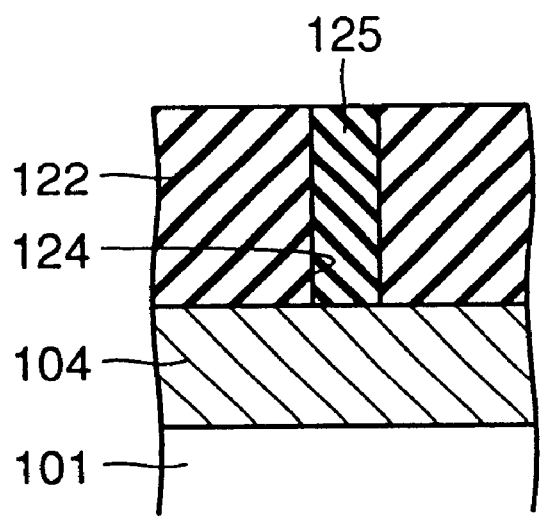
FIG. 29 is a sectional view of the semiconductor device of the second conventional art showing a step carried out subsequent to the step of FIG. 28.
Figure 30:
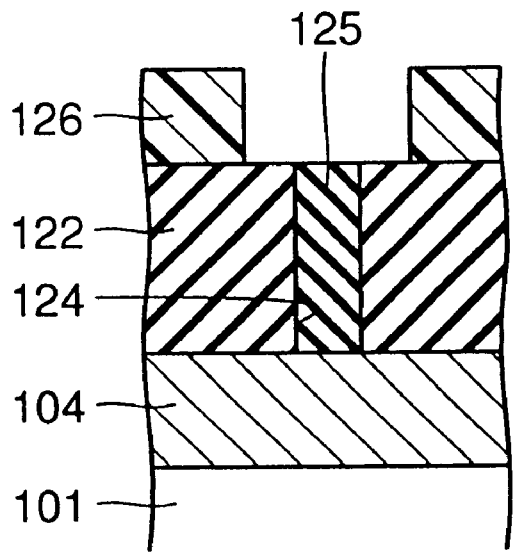
FIG. 30 is a sectional view of the semiconductor device of the second conventional art showing a step carried out subsequent to the step of FIG. 29.
Figure 31:
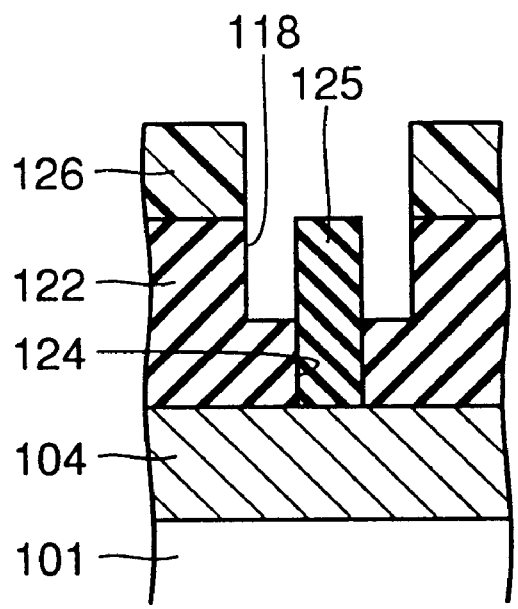
FIG. 31 is a sectional view of the semiconductor device of the second conventional art showing a step carried out subsequent to the step of FIG. 30.
Figure 32:
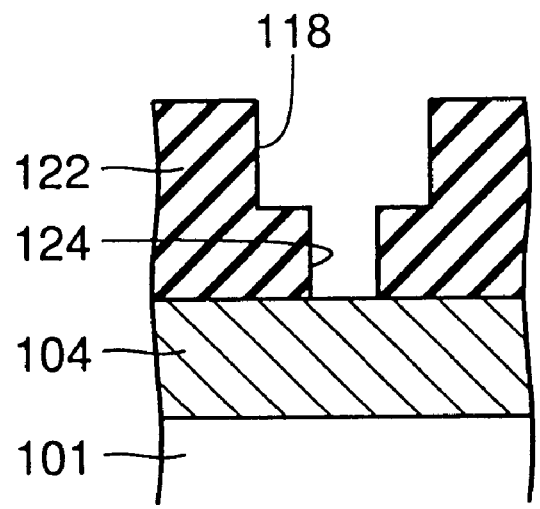
FIG. 32 is a sectional view of the semiconductor device of the second conventional art showing a step carried out subsequent to the step of FIG. 31.
Figure 33:
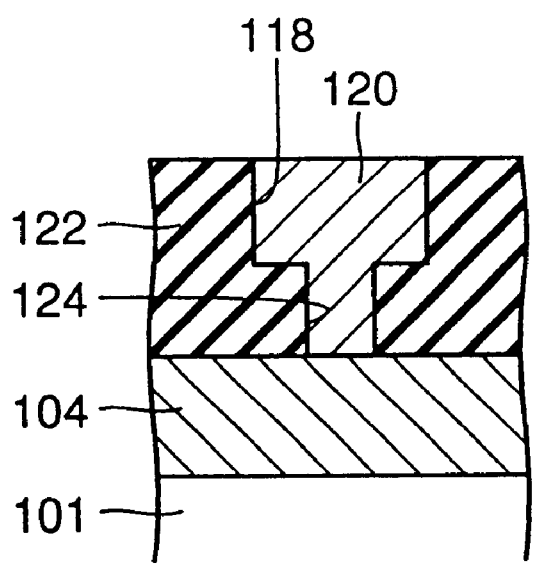
FIG. 33 is a sectional view of the semiconductor device of the second conventional art showing a step carried out subsequent to the step of FIG. 32.

According to the etching condition, upper SOG film 40 can be etched without substantially etching lower TEOS film 38. The depth of upper interconnection trench 18 can be set substantially constant, not dependent on the width of the interconnection. Referring to FIG. 19, steps similar to those shown in FIGS. 4 and 5 described in the first embodiment are carried out to result in the structure shown in FIG. 19. Thus, the main part of the multilayer interconnection structure constituted by buried interconnections in a semiconductor device is completed.

In the semiconductor device obtained by the above-described fabrication method, TiN barrier film 32 is provided as a conductive etching stopper film only right above lower interconnection 4. An upper trench etching stopper film formed of an insulation film such as a silicon nitride film is not provided right under upper interconnection 20, as in a conventional semiconductor device. Therefore, the capacitance between two adjacent upper interconnections can be reduced, as described in detail in the first embodiment.

Since an insulation film functioning as an etching stopper film such as a silicon nitride film is not provided right above lower interconnection 4, the capacitance between two adjacent lower interconnections 4 can also be reduced. As a result, the performance of the semiconductor device can be improved significantly.

Since the depth of the upper interconnection trench 18 can be set substantially constant, not dependent on the width of the interconnection, variation in the interconnection resistance of upper interconnection 20 formed in upper interconnection trench 18 can be reduced.

In the above first to third embodiments, a copper interconnection can be employed for lower interconnection 4 and upper interconnection 20, in addition to aluminum or aluminum alloy interconnections.

In each of the above embodiments, an ECR type RIE device has been employed as the dry etching device. Alternatively, a parallel panel type RIE device, magnetron RIE device, or an ICP type RIE device can be employed. By applying conditions corresponding to the etching device, each of the above-described semiconductor device can be produced.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate having a main surface;
   a first interconnection formed on said semiconductor substrate;
   an etching stopper film formed to directly cover said first interconnection;
   a first insulation film formed to directly cover said etching stopper film;
   a second insulation film formed to directly cover said first insulation film;
   an interconnection trench formed in said second insulation film, and exposing an upper surface of said first insulation film; and
   a second interconnection formed in said interconnection trench, wherein said first and second insulation films have different anisotropic etching rates such that said second insulation film can be etched without substantially etching the first insulation film.

2. The semiconductor device according to claim 1, wherein said first insulation film includes a silicon oxide film formed by plasma chemical vapor deposition, said second insulation film includes a silicon oxide film formed by a spin-on-glass process, and said etching stopper film includes a silicon nitride film.

3. A semiconductor device comprising:
   a semiconductor substrate having a main surface;
   a first interconnection formed on said semiconductor substrate;
   a conductive etching stopper film formed to directly cover said first interconnection;

a first insulation film formed to directly cover said conductive etching stopper film;

a second insulation film formed to directly cover said first insulation film, and having an etching property differing from the etching property of said first insulation film;

a third insulation film formed to directly cover said second insulation film;

an interconnection trench formed in said third insulation film, and exposing an uppermost surface of said second insulation film; and a second interconnection formed in said interconnection trench.

4. The semiconductor device according to claim 3, wherein said second and third insulation films have different anisotropic etching rates such that the third insulation film can be etched without substantially etching the second insulation film.

5. The semiconductor device according to claim 3, wherein said third insulation film includes a silicon oxide film formed by a spin-on-glass process, and said second insulation film includes a silicon oxide film formed by plasma chemical vapor deposition.

6. The semiconductor device according to claim 1, wherein said first and second interconnections include a copper interconnection.

7. The semiconductor device according to claim 3, wherein said first and second interconnections include a copper interconnection.

8. The semiconductor device according to claim 3, wherein the first interconnection has an upper surface and side surfaces, and the conductive etching stopper film is formed on said upper surface of said first interconnection but not on said side surfaces of said first interconnection.

* * * * *